United States Patent
Hsu et al.

(10) Patent No.: US 9,484,094 B2
(45) Date of Patent: Nov. 1, 2016

(54) CONTROL METHOD OF RESISTIVE RANDOM-ACCESS MEMORY

(71) Applicant: eMemory Technology Inc., Hsin-Chu (TW)

(72) Inventors: Chia-Jung Hsu, Taoyuan (TW); Wein-Town Sun, Taoyuan (TW); Chun-Yuan Lo, Taipei (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 14/872,426

(22) Filed: Oct. 1, 2015

(65) Prior Publication Data
US 2016/0211020 A1 Jul. 21, 2016

Related U.S. Application Data

(60) Provisional application No. 62/105,744, filed on Jan. 21, 2015.

(51) Int. Cl.
*G11C 13/00* (2006.01)
(52) U.S. Cl.
CPC ....... *G11C 13/0097* (2013.01); *G11C 13/0002* (2013.01); *G11C 13/004* (2013.01); *G11C 13/0007* (2013.01); *G11C 13/0064* (2013.01)
(58) Field of Classification Search
CPC .......... G11C 13/0097; G11C 13/0002; G11C 13/0007; G11C 13/0064; G11C 13/004
See application file for complete search history.

(56) References Cited

U.S. PATENT DOCUMENTS

| 8,804,401 | B2 | 8/2014 | Sugimae et al. | |
| 8,861,258 | B2 | 10/2014 | Lan et al. | |
| 8,958,233 | B2* | 2/2015 | Chen | G11C 11/00 365/148 |
| 2010/0014343 | A1* | 1/2010 | Wei | G11C 11/5685 365/148 |
| 2013/0044534 | A1* | 2/2013 | Kawai | G11C 13/0007 365/148 |
| 2016/0118119 | A1* | 4/2016 | Strand | G11C 29/08 365/148 |

* cited by examiner

*Primary Examiner* — J. H. Hur
*Assistant Examiner* — Ajay Ojha
(74) *Attorney, Agent, or Firm* — WPAT, PC; Justin King

(57) ABSTRACT

A control method of a resistive random-access memory is provided. Firstly, an action is performed on the resistive random-access memory, so that the resistive random-access memory has a specified state. Then, an operation period begins. During a first sub-period of the operation period, a first control signal with a first polarity is provided. During a second sub-period of the operation period, a second control signal with a second polarity is provided. During a third sub-period of the operation period, a third control signal with the first polarity is provided. During a fourth sub-period of the operation period, a read signal is provided, so that the resistive random-access memory generates a read current. According to the read current, a controlling circuit verifies whether the resistive random-access memory is in the specified state.

12 Claims, 9 Drawing Sheets

CONTROL METHOD OF RESISTIVE RANDOM-ACCESS MEMORY

This application claims the benefit of U.S. provisional application Ser. No. 62/105,744, filed Jan. 21, 2015, the subject matter of which is incorporated herein by reference.

FIELD OF THE INVENTION

The present invention relates to a control method of a memory, and more particularly to a control method of a resistive random-access memory.

BACKGROUND OF THE INVENTION

A resistive random-access memory (RRAM) is one kind of non-volatile memory. Since the resistive random-access memories have larger storage capability and higher accessing speed, the manufacturers of the memories pay much attention to the development of the resistive random-access memories.

FIG. 1 schematically illustrates the structure of a resistive random-access memory. As shown in FIG. 1, the resistive random-access memory 100 comprises a top electrode 102, an insulation layer 104 and a bottom electrode 106. After the resistive random-access memory is fabricated, the resistive random-access memory is in an initial state.

Before the normal operation of the resistive random-access memory 100, a forming action is performed to apply a first voltage difference (e.g., +3V) to the top electrode 102 and the bottom electrode 106. For example, the top electrode 102 receives a voltage of +3V, and the bottom electrode 106 receives a ground voltage. While the forming action is performed, the cluster of oxygen vacancies in the insulation layer 104 forms a conducting filament 108. In addition, the conducting filament 108 is connected with the top electrode 102 and the bottom electrode 106. After the conducting filament 108 is formed, the forming action is completed. Meanwhile, the region between the top electrode 102 and the bottom electrode 106 has a low resistance value (i.e., in a set state). Consequently, the resistive random-access memory 100 can be normally operated.

Moreover, a reset action may be performed to switch the set state to a reset state (i.e., a high resistance value). While the reset action is performed, a second voltage difference (e.g., −3V) is applied to the top electrode 102 and the bottom electrode 106. For example, the top electrode 102 receives a voltage of −3V, and the bottom electrode 106 receives the ground voltage. After the reset action is completed, the conducting filament 108 within the insulation layer 104 is treated by a redox process. Consequently, the conducting filament 108 is no longer connected between the top electrode 102 and the bottom electrode 106. Meanwhile, the region between the top electrode 102 and the bottom electrode 106 has the high resistance value (i.e., in the reset state).

In case that the resistive random-access memory 100 is in the reset state, the resistive random-access memory 100 may be switched to the set state by a set action. While the set action is performed, a third voltage difference (e.g., +3V) is applied to the top electrode 102 and the bottom electrode 106. For example, the top electrode 102 receives a voltage of +3V, and the bottom electrode 106 receives the ground voltage. After the set action is completed, the region between the top electrode 102 and the bottom electrode 106 has the low resistance value (i.e., in the set state).

Consequently, in response to a program action during a program cycle, the resistive random-access memory 100 can be selectively in the set state through the set action or in the reset state through the rest action. In other words, the set state and the reset state are two storing states of the resistive random-access memory 100.

Moreover, in response to a read action during a read cycle, a read voltage (e.g., 0.1V~0.5V) is applied to the top electrode 102 and the bottom electrode 106. Consequently, according to the magnitude of a read current generated by the resistive random-access memory 100, the storing state (i.e., the set state or the reset state) of the resistive random-access memory 100 can be realized.

However, since the fabricating process of the resistive random-access memory 100 is usually unstable, the reliability of the resistive random-access memory 100 is not satisfied. Consequently, each set action or each reset action is completed after plural operation periods.

FIG. 2A is a schematic timing waveform diagram of a conventional resistive random-access memory while a set action and a reset action are performed. Generally, the resistive random-access memory is connected with a controlling circuit (not shown). Moreover, the controlling circuit controls the set action or the reset action of the resistive random-access memory.

Generally, each of the set action and the reset action are completed after plural operation periods Oper1~Oper4. Moreover, each operation period of the set action contains a setting period and a verifying period, and each operation period of the reset action contains a resetting period and a verifying period.

Please refer to the set action of FIG. 2A. During the setting period of the first operation period Oper1, a set voltage Vset (e.g., +3V) is applied to the top electrode and the bottom electrode of the resistive random-access memory. Consequently, the resistive random-access memory is in the set state. During the verifying period of the first operation period Oper1, a read voltage Vv is applied to the top electrode and the bottom electrode of the resistive random-access memory. According to the magnitude of a read current generated by the resistive random-access memory, the control circuit can verify whether the resistive random-access memory is in the set state.

If the control circuit confirms that the resistive random-access memory is in the set state according to the read current, the subsequent procedures of the set action after the first operation period Oper1 will not be performed. Whereas, if the control circuit confirms that the resistive random-access memory is not in the set state according to the read current, the subsequent procedures of the set action corresponding to the operation periods Oper2, Oper3 and/or Oper4 will be performed. That is, plural procedures of the set action corresponding to plural operation periods are possibly performed until the control circuit confirms that the resistive random-access memory is in the set state.

Please refer to the reset action of FIG. 2A. During the resetting period of the first operation period Oper1, a reset voltage Vreset (e.g., −3V) is applied to the top electrode and the bottom electrode of the resistive random-access memory. Consequently, the resistive random-access memory is in the reset state. During the verifying period of the first operation period Oper1, a read voltage Vv is applied to the top electrode and the bottom electrode of the resistive random-access memory. According to the magnitude of a read current generated by the resistive random-access memory, the control circuit can verify whether the resistive random-access memory is in the reset state.

If the control circuit confirms that the resistive random-access memory is in the reset state according to the read current, the subsequent procedures of the set action after the first operation period Oper1 will not be performed. Whereas, if the control circuit confirms that the resistive random-access memory is not in the reset state according to the read current, the subsequent procedures of the set action corresponding to the operation periods Oper2, Oper3 and/or Oper4 will be performed. That is, plural procedures of the reset action are possibly performed until the control circuit confirms that the resistive random-access memory is in the reset state.

FIG. 2B is another schematic timing waveform diagram of a conventional resistive random-access memory while a set action and a reset action are performed. Generally, each of the set action and the reset action are completed after plural operation periods Oper1~Oper3. Moreover, in each of the set action and the reset action, each operation period contains a setting period, a resetting period and a verifying period. The operation period of the set action contains the setting period, the verifying period and the resetting period sequentially. The operation period of the reset action contains the resetting period, the verifying period and the setting period sequentially.

During the setting period of the first operation period Oper1, a set voltage Vset (e.g., +3V) is applied to the top electrode and the bottom electrode of the resistive random-access memory. Consequently, the resistive random-access memory is in the set state. During the verifying period of the first operation period Oper1, a read voltage Vv is applied to the top electrode and the bottom electrode of the resistive random-access memory. According to the magnitude of a read current generated by the resistive random-access memory, the control circuit can verify whether the resistive random-access memory is in the set state. During the resetting period of the first operation period Oper1, a reset voltage Vreset (e.g., −3V) is applied to the top electrode and the bottom electrode of the resistive random-access memory. Consequently, the resistive random-access memory is in the reset state.

Please refer to the set action of FIG. 2B. During the setting period of the first operation period Oper1, the resistive random-access memory is in the set state. During the verifying period of the first operation period Oper1, the control circuit can verify whether the resistive random-access memory is in the set state according to the magnitude of the read current generated by the resistive random-access memory.

If the control circuit confirms that the resistive random-access memory is in the set state according to the read current, the subsequent procedure of the reset action corresponding to the first operation period Oper1 will not be performed. Meanwhile, the set action is completed. Whereas, if the control circuit confirms that the resistive random-access memory is not in the set state according to the read current, the subsequent procedures of the set action corresponding to the operation periods Oper2 and/or Oper3 will be performed.

As shown in FIG. 2B, the set action is completed after three operation periods Oper1~Oper3. During the verifying period of the third operation period Oper3, the control circuit verifies that the resistive random-access memory is in the set state. Consequently, the subsequent procedure of the resetting period corresponding to the third operation period Oper3 will not be performed.

Please refer to the reset action of FIG. 2B. During the resetting period of the first operation period Oper1, the resistive random-access memory is in the reset state. During the verifying period of the first operation period Oper1, the control circuit can verify whether the resistive random-access memory is in the reset state according to the magnitude of the read current generated by the resistive random-access memory.

If the control circuit confirms that the resistive random-access memory is in the reset state according to the read current, the subsequent procedure of the set action corresponding to the first operation period Oper1 will not be performed. Meanwhile, the reset action is completed. Whereas, if the control circuit confirms that the resistive random-access memory is not in the reset state according to the read current, the subsequent procedures of the reset action corresponding to the operation periods Oper2 and/or Oper3 will be performed.

As shown in FIG. 2B, the reset action is completed after two operation periods Oper1~Oper2. During the verifying period of the second operation period Oper2, the control circuit verifies that the resistive random-access memory is in the reset state. Consequently, the subsequent procedure of the set period corresponding to the second operation period Oper2 will not be performed.

However, the above approaches still have some drawbacks. For example, after the set action on the resistive random-access memory is completed, the controlling circuit is still unable to stably control the resistive random-access memory in the set state. In addition, after the reset action on the resistive random-access memory is completed, the controlling circuit is still unable to stably control the resistive random-access memory in the reset state.

SUMMARY OF THE INVENTION

The present invention provides a control method of a resistive random-access memory. The control method provides various signals for controlling the set action and the reset action of the resistive random-access memory.

An embodiment of the present invention provides a control method of a resistive random-access memory is provided. Firstly, an action is performed on the resistive random-access memory, so that the resistive random-access memory has a specified state. Then, an operation period begins. During a first sub-period of the operation period, a first control signal with a first polarity is provided to the resistive random-access memory. During a second sub-period of the operation period, a second control signal with a second polarity is provided to the resistive random-access memory. During a third sub-period of the operation period, a third control signal with the first polarity is provided to the resistive random-access memory. During a fourth sub-period of the operation period, a read signal is provided to the resistive random-access memory, so that the resistive random-access memory generates a read current. According to the read current, a controlling circuit verifies whether the resistive random-access memory is in the specified state.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
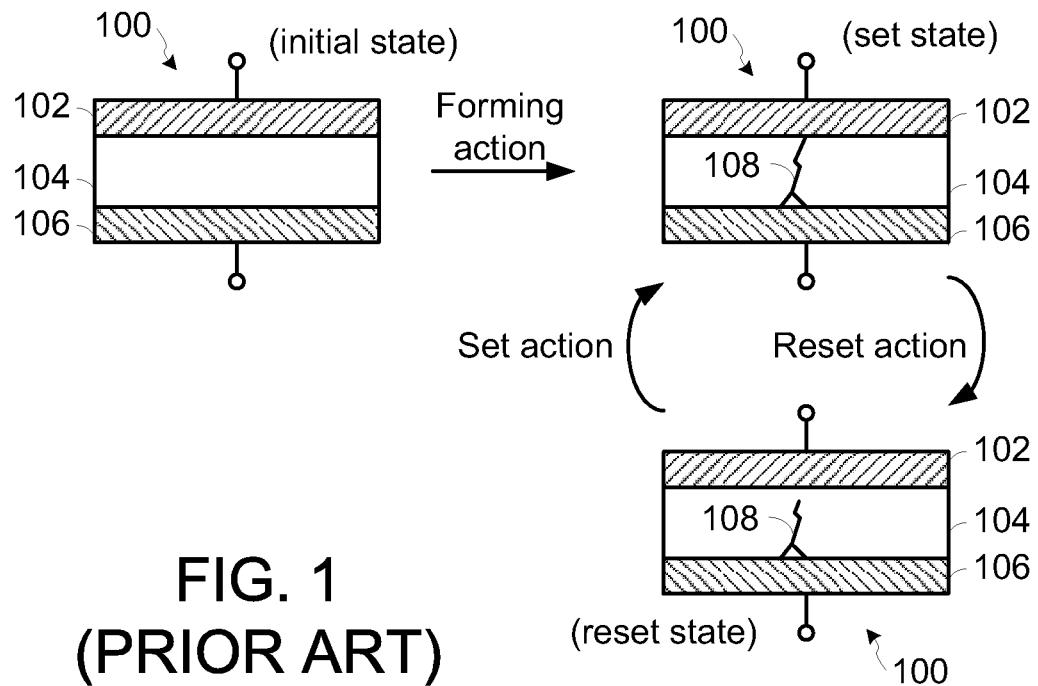
FIG. 1 (prior art) schematically illustrates the structure of a resistive random-access memory.
Figure 2A:
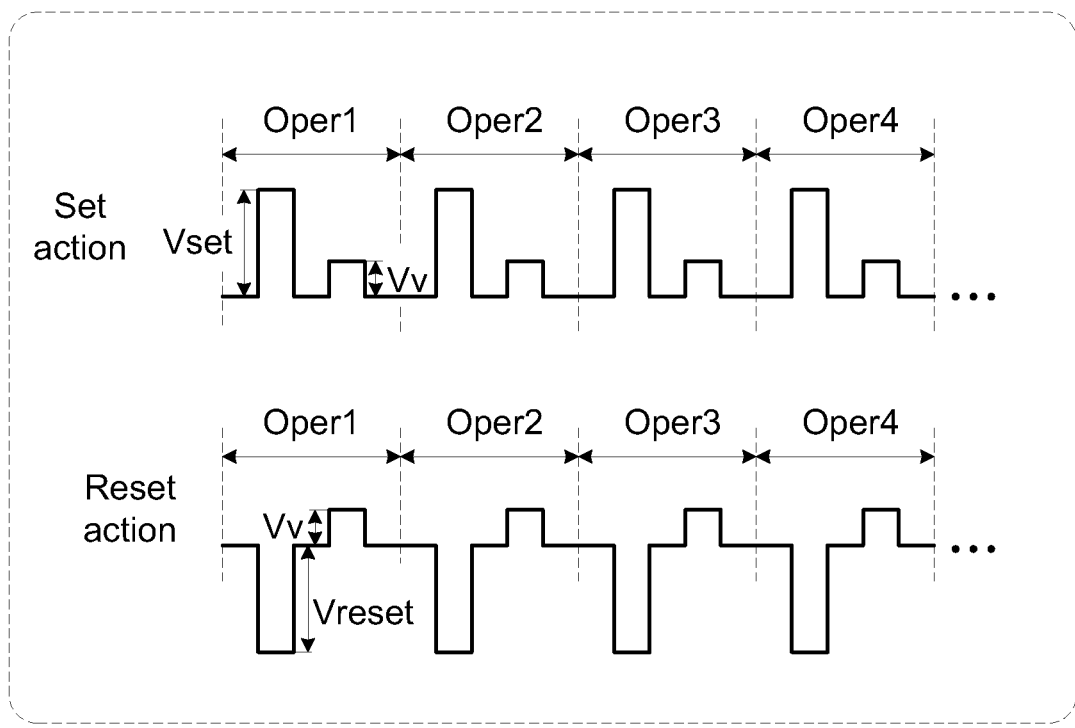
FIG. 2A (prior art) is a schematic timing waveform diagram of a conventional resistive random-access memory while a set action and a reset action are performed.
Figure 2B:
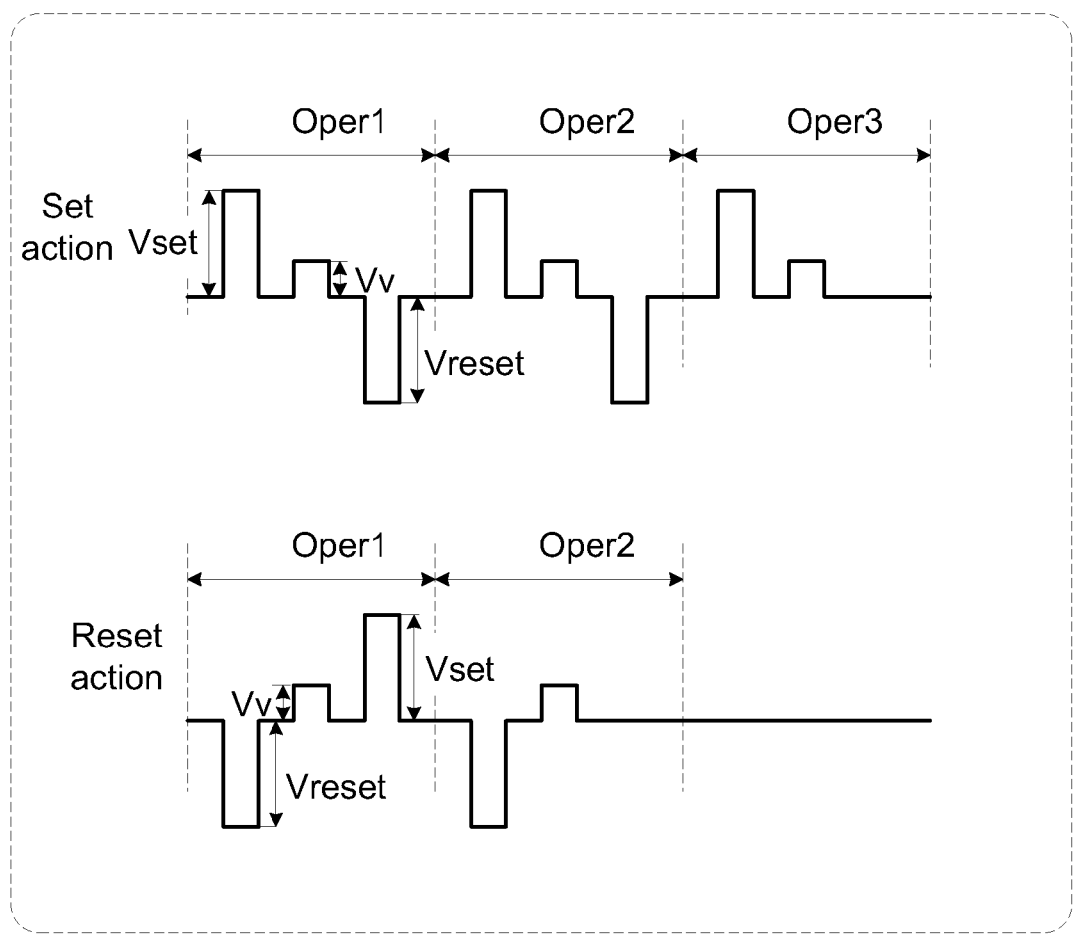
FIG. 2B (prior art) is another schematic timing waveform diagram of a conventional resistive random-access memory while a set action and a reset action are performed.
Figure 3A:
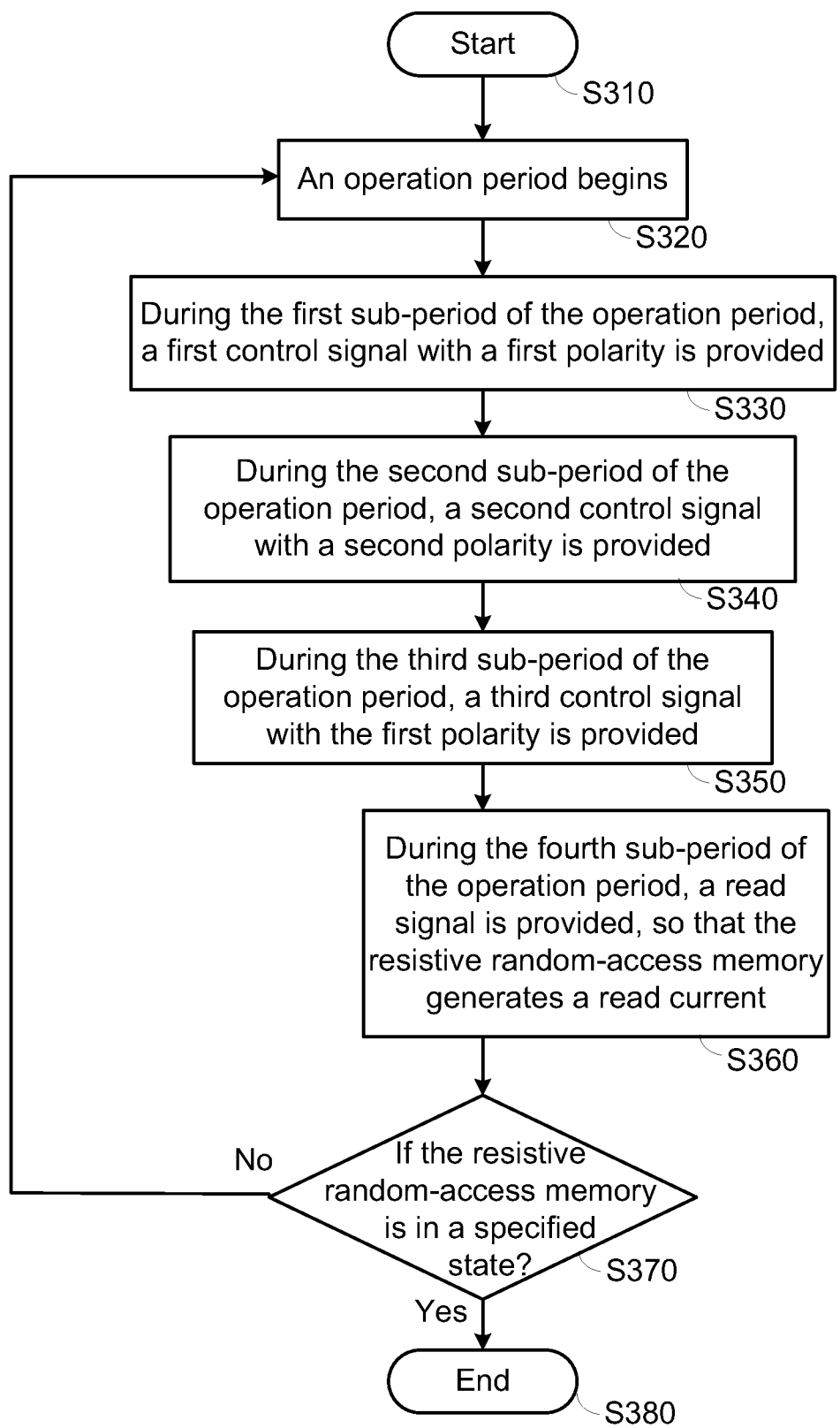
FIG. 3A is a flowchart illustrating a control method of a resistive random-access memory according to a first embodiment of the present invention.

FIG. 3A is a flowchart illustrating a control method of a resistive random-access memory according to a first embodiment of the present invention. The resistive random-access memory is connected with a controlling circuit (not shown). The flowchart of FIG. 3A is controlled by the controlling circuit.

After a set action or a reset action is started (Step S310), an operation period begins (Step S320). The operation period contains four sub-periods.

During the first sub-period of the operation period, a first control signal with a first polarity is provided to the resistive random-access memory (Step S330). During the second sub-period of the operation period, a second control signal with a second polarity is provided to the resistive random-access memory (Step S340). During the third sub-period of the operation period, a third control signal with the first polarity is provided to the resistive random-access memory (Step S350). During the fourth sub-period of the operation period, a read signal is provided to the resistive random-access memory, so that the resistive random-access memory generates a read current (Step S360). According to the magnitude of the read current, the controlling circuit can verify whether the resistive random-access memory is in a specified state.

Then, the controlling circuit judges whether the resistive random-access memory is in the specified state according to the read current (Step S370). If the controlling circuit confirms that the resistive random-access memory is in the specified state according to the read current, the set action or the reset action is ended (Step S380). Whereas, if the controlling circuit confirms that the resistive random-access memory is not in the specified state according to the read current, the step S320 is repeatedly done.

Figure 3B:
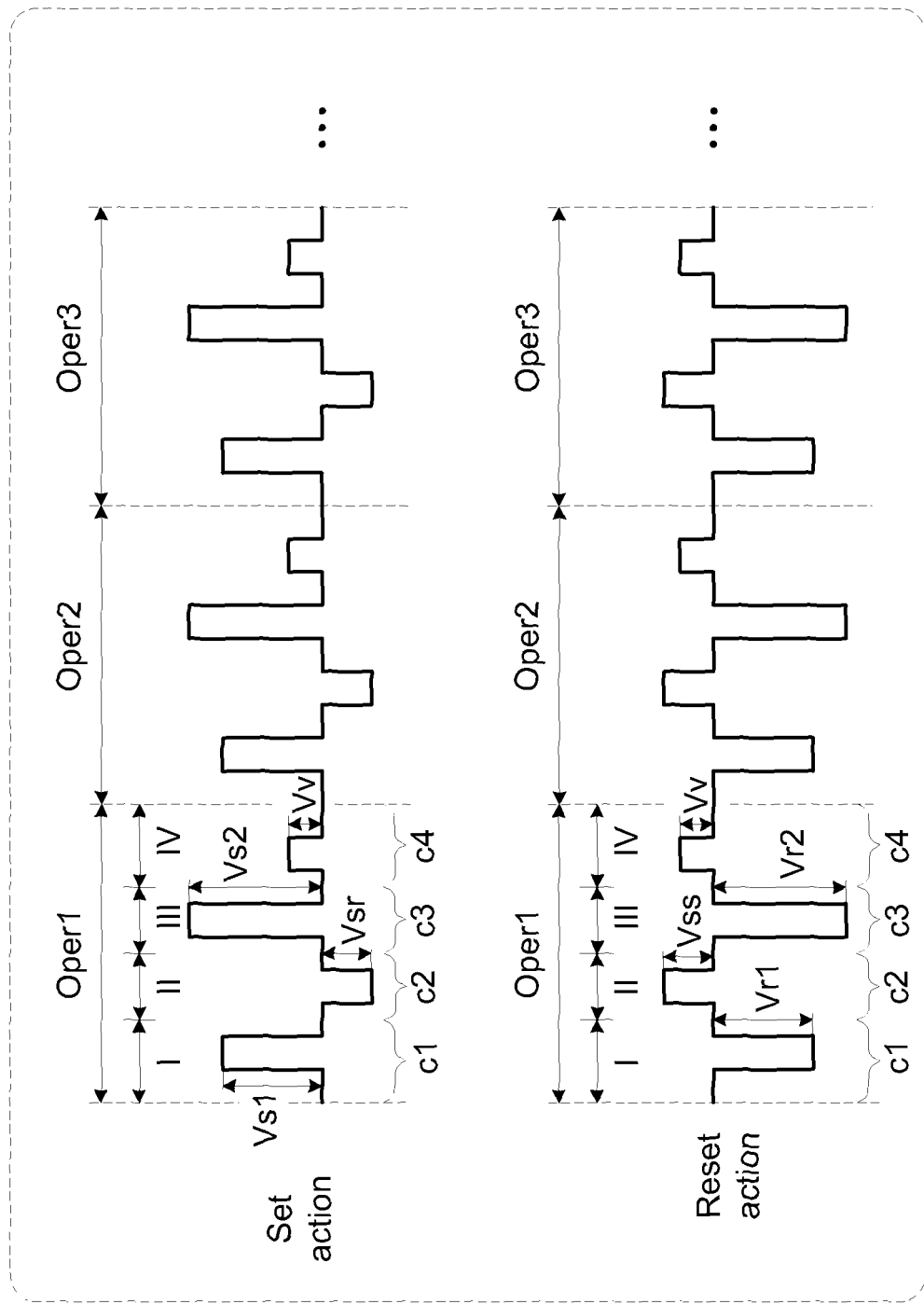
FIG. 3B is a schematic timing waveform diagram of the resistive random-access memory according to the first embodiment of the present invention while a set action and a reset action are performed.

FIG. 3B is a schematic timing waveform diagram of the resistive random-access memory according to the first embodiment of the present invention while a set action and a reset action are performed. In case that the set action is performed, the specified state is a set state. Whereas, in case that the reset action is performed, the specified state is a reset state.

Please refer to FIG. 3B. For performing the set action, a first operation period Oper1 begins. The first operation period Oper1 is divided into four sub-periods I, II, III and IV sequentially. Moreover, a first control signal c1, a second control signal c2, a third control signal c3 and a read signal c4 are generated during the sub-periods I, II, III and IV, respectively.

The first control signal c1, the second control signal c2, the third control signal c3 and the read signal c4 are collaboratively defined as a waveform of the first operation period Oper1.

During the first sub-period I, the first control signal c1 with a positive polarity is provided to the resistive random-access memory. According to the first control signal c1, the resistive random-access memory is in the set state. During the second sub-period, the second control signal c2 with a negative polarity is provided to the resistive random-access memory. During the third sub-period, the third control signal c3 with the positive polarity is provided to the resistive random-access memory. According to the third control signal c3, the resistive random-access memory is in the set state. During the fourth sub-period, the read signal c4 is provided to the resistive random-access memory, so that the resistive random-access memory generates a read current. According to the magnitude of the read current, the controlling circuit can verify whether the resistive random-access memory is in the set state.

If the controlling circuit confirms that the resistive random-access memory is in the set state, the set action is ended. Whereas, if the controlling circuit confirms that the resistive random-access memory is not in the set state, the subsequent procedure of the set action corresponding to the second operation period Oper2 will be performed.

From the above descriptions, plural procedures of the set action corresponding to plural operation periods are possibly performed until the control circuit confirms that the resistive random-access memory is in the set state.

In an embodiment, the first control signal c1, the second control signal c2 and the third control signal c3 are voltage signals or current signals. Moreover, the amplitude Vs2 of the third control signal c3 is higher than or equal to the amplitude Vs1 of the first control signal c1, and the amplitude Vs1 of the first control signal c1 is higher than or equal to the amplitude Vsr of the second control signal c2. Moreover, the amplitude of the read signal c4 is in the range between +0.1V and +0.5V.

In an implementation example, the first control signal c1 has the amplitude Vs1 in the range between +2V and +3V and has the pulse width of 100 ns, the second control signal c2 has the amplitude Vsr in the range between −0.8V and −1.5V and has the pulse width of 20 ns, and the third control signal c3 has the amplitude Vs2 in the range between +3V and +3.5V and has the pulse width of 2 μs.

From the above descriptions, the resistive random-access memory is sequentially applied with the control signals c1, c2 and c3 which are with different polarity while the set action is performed. Consequently, the stability, the data retention and the reliability of the resistive random-access memory are largely improved.

Please refer to FIG. 3B again. For performing the reset action, a first operation period Oper1 begins. The first operation period Oper1 is divided into four sub-periods I, II, III and IV sequentially. Moreover, a first control signal c1, a second control signal c2, a third control signal c3 and a read signal c4 are generated during the sub-periods I, II, III and IV, respectively. The first control signal c1, the second control signal c2, the third control signal c3 and the read signal c4 are collaboratively defined as a waveform of the first operation period Oper1.

During the first sub-period I, a first control signal c1 with a negative polarity is provided to the resistive random-access memory. According to the first control signal c1, the resistive random-access memory is in the reset state. During the second sub-period, the second control signal c2 with a positive polarity is provided to the resistive random-access memory. During the third sub-period, the third control signal c3 with the negative polarity is provided to the resistive random-access memory. According to the third control signal c3, the resistive random-access memory is in the reset state. During the fourth sub-period, the read signal c4 is provided to the resistive random-access memory, so that the resistive random-access memory generates a read current. According to the magnitude of the read current, the controlling circuit can verify whether the resistive random-access memory is in the reset state.

If the controlling circuit confirms that the resistive random-access memory is in the reset state, the reset action is ended. Whereas, if the controlling circuit confirms that the resistive random-access memory is not in the reset state, the subsequent procedure of the reset action corresponding to the second operation period Oper2 will be performed.

From the above descriptions, plural procedures of the reset action corresponding to plural operation periods are possibly performed until the control circuit confirms that the resistive random-access memory is in the reset state.

In an embodiment, the first control signal c1, the second control signal c2 and the third control signal c3 are voltage signals or current signals. Moreover, the amplitude Vr2 of the third control signal c3 is higher than or equal to the amplitude Vr1 of the first control signal c1, and the amplitude Vr1 of the first control signal c1 is higher than or equal to the amplitude Vss of the second control signal c2. Moreover, the amplitude of the read signal c4 is in the range between +0.1V and +0.5V.

In an implementation example, the first control signal c1 has the amplitude Vr1 in the range between −2V and −3V and has the pulse width of 100 ns, the second control signal c2 has the amplitude Vss in the range between +0.8V and +1.5V and has the pulse width of 20 ns, and the third control signal c3 has the amplitude Vr2 in the range between −3V and −3.5V and has the pulse width of 2 μs.

From the above descriptions, the resistive random-access memory is sequentially applied with the control signals c1, c2 and c3 which are with different polarity while the reset action is performed. Consequently, the stability, the data retention and the reliability of the resistive random-access memory are largely improved.

Figure 4A:
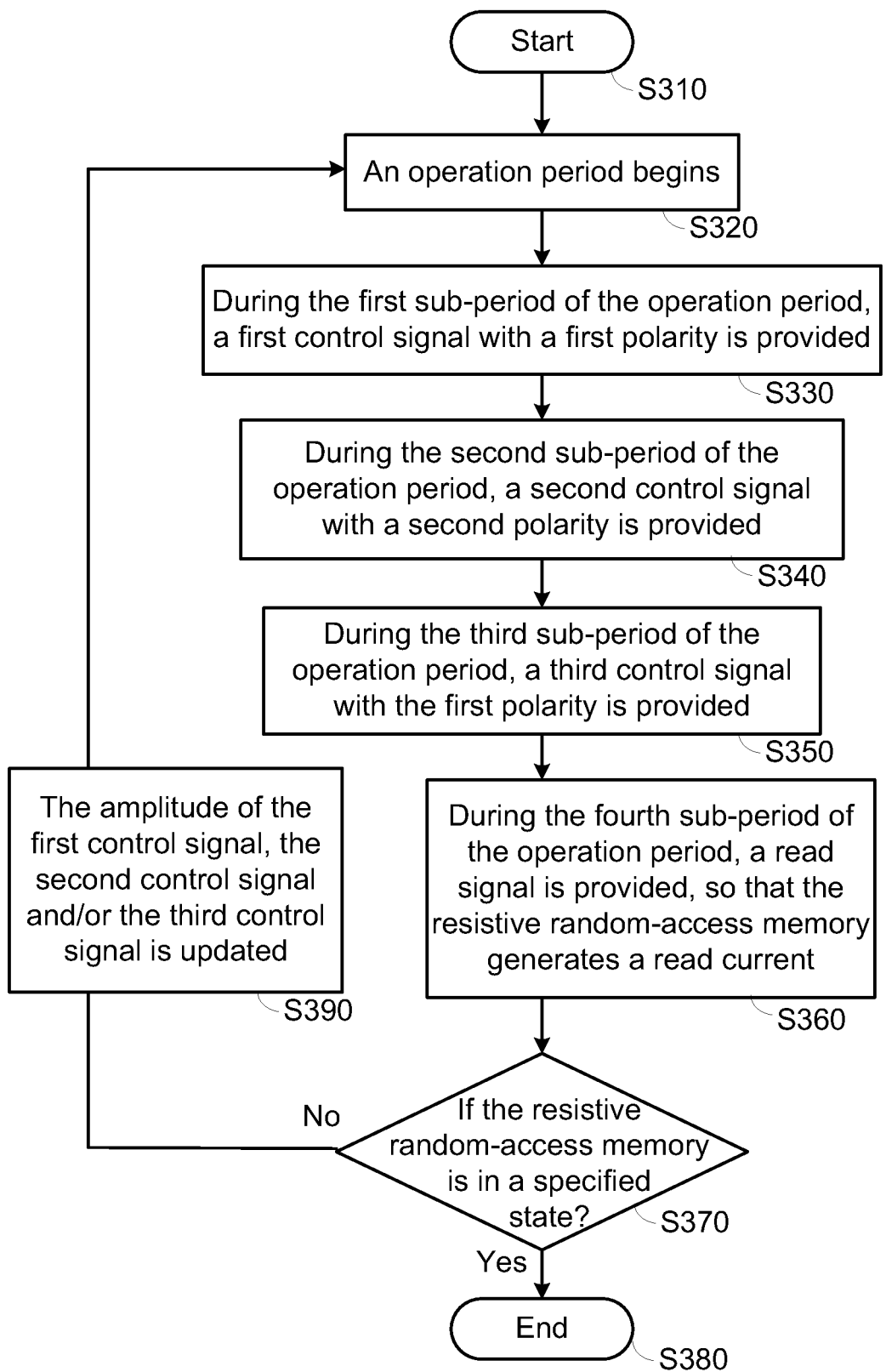
FIG. 4A is a flowchart illustrating a control method of a resistive random-access memory according to a second embodiment of the present invention.

FIG. 4A is a flowchart illustrating a control method of a resistive random-access memory according to a second embodiment of the present invention. In comparison with the first embodiment, the control method of the second embodiment further comprises a step S390.

If the controlling circuit confirms that the resistive random-access memory is not in the specified state according to the read current, the amplitude of the first control signal, the second control signal and/or the third control signal is updated (Step S390). After the step S390, the step S320 is repeatedly done. The procedures of the other steps are similar to those of the first embodiment, and are not redundantly described herein.

In this embodiment, the amplitude of the first control signal, the second control signal and/or the third control signal is updated before the next operation period begins. In the step S390, the amplitudes of the three control signals are simultaneously updated, the amplitudes of any two of the three control signals are simultaneously updated or the amplitude of any control signal is updated.

Figure 4B:
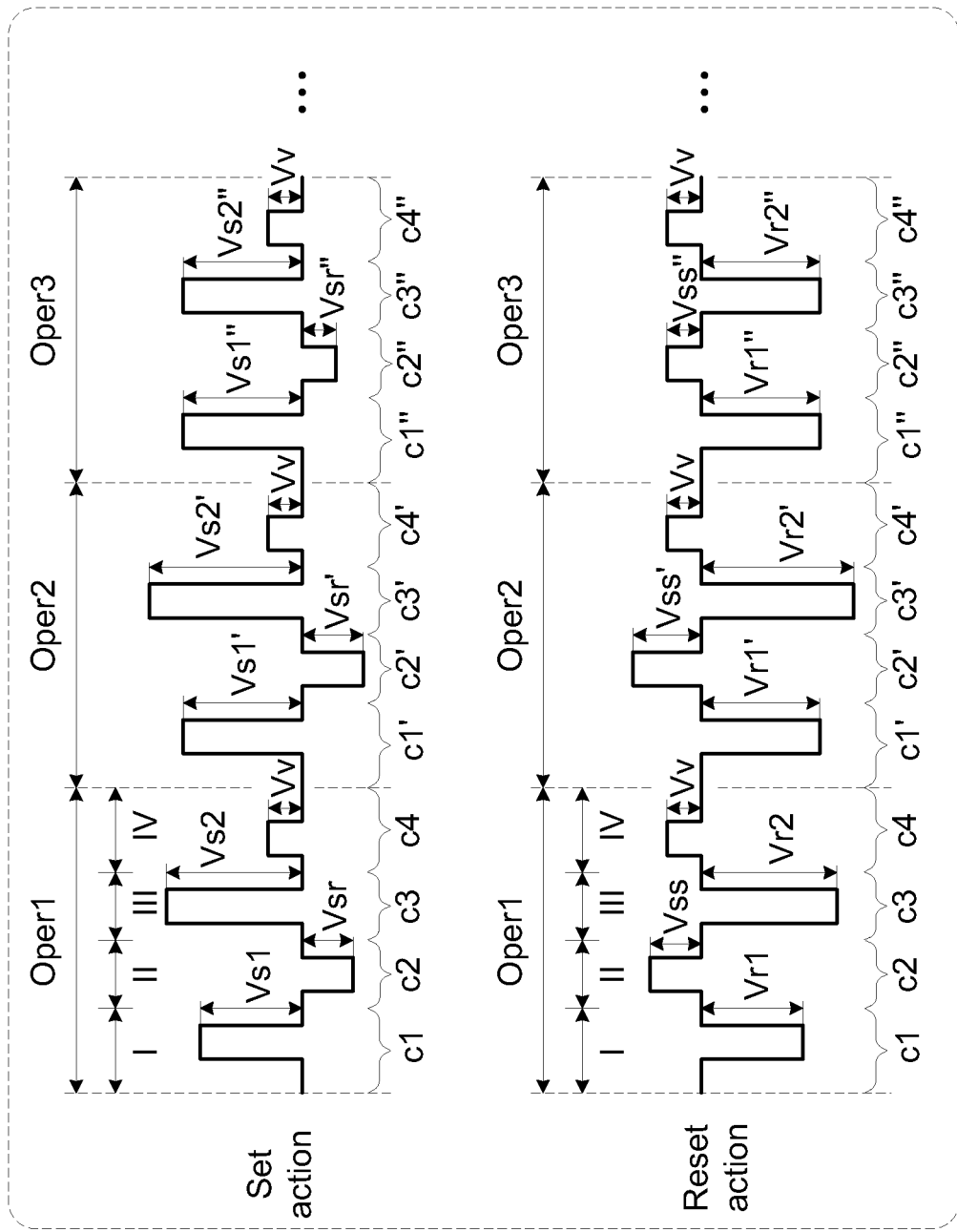
FIG. 4B is a schematic timing waveform diagram of the resistive random-access memory according to the second embodiment of the present invention while a set action and a reset action are performed.

FIG. 4B is a schematic timing waveform diagram of the resistive random-access memory according to the second embodiment of the present invention while a set action and a reset action are performed.

Please refer to the waveform corresponding to the set action. Before the second operation period Oper2 begins, the updated first control signal c1', the updated second control signal c2' and the updated third control signal c3' are sequentially provided to the resistive random-access memory. Before the third operation period Oper3 begins, the updated first control signal c1", the updated second control signal c2" and the updated third control signal c3" are sequentially provided to the resistive random-access memory.

Moreover, during each operation period of the set action, the amplitude of the third control signal is higher than or equal to the amplitude of the first control signal, and the amplitude of the first control signal is higher than or equal to the amplitude of the second control signal. For example during the second operation period Oper2, the amplitude Vs2' of the third control signal c3' is higher than or equal to the amplitude Vs1' of the first control signal c1', and the amplitude Vs1' of the first control signal c1' is higher than or equal to the amplitude Vsr' of the second control signal c2'. Moreover, during the third operation period Oper3, the amplitude Vs2" of the third control signal c3" is higher than or equal to the amplitude Vs1" of the first control signal c1", and the amplitude Vs1" of the first control signal c1" is higher than or equal to the amplitude Vsr" of the second control signal c2".

Please refer to the waveform corresponding to the reset action. Before the second operation period Oper2 begins, the updated first control signal c1', the updated second control signal c2' and the updated third control signal c3' are sequentially provided to the resistive random-access memory. Before the third operation period Oper3 begins, the updated first control signal c1", the updated second control signal c2" and the updated third control signal c3" are sequentially provided to the resistive random-access memory.

Moreover, during each operation period of the reset action, the amplitude of the third control signal is higher than or equal to the amplitude of the first control signal, and the amplitude of the first control signal is higher than or equal to the amplitude of the second control signal.

For example during the second operation period Oper2, the amplitude Vr2' of the third control signal c3' is higher than or equal to the amplitude Vr1' of the first control signal c1', and the amplitude Vr1' of the first control signal c1' is higher than or equal to the amplitude Vss' of the second control signal c2'. Moreover, during the third operation period Oper3, the amplitude Vr2" of the third control signal c3" is higher than or equal to the amplitude Vr1" of the first control signal c1", and the amplitude Vr1" of the first control signal c1" is higher than or equal to the amplitude Vss" of the second control signal c2".

Figure 5A:
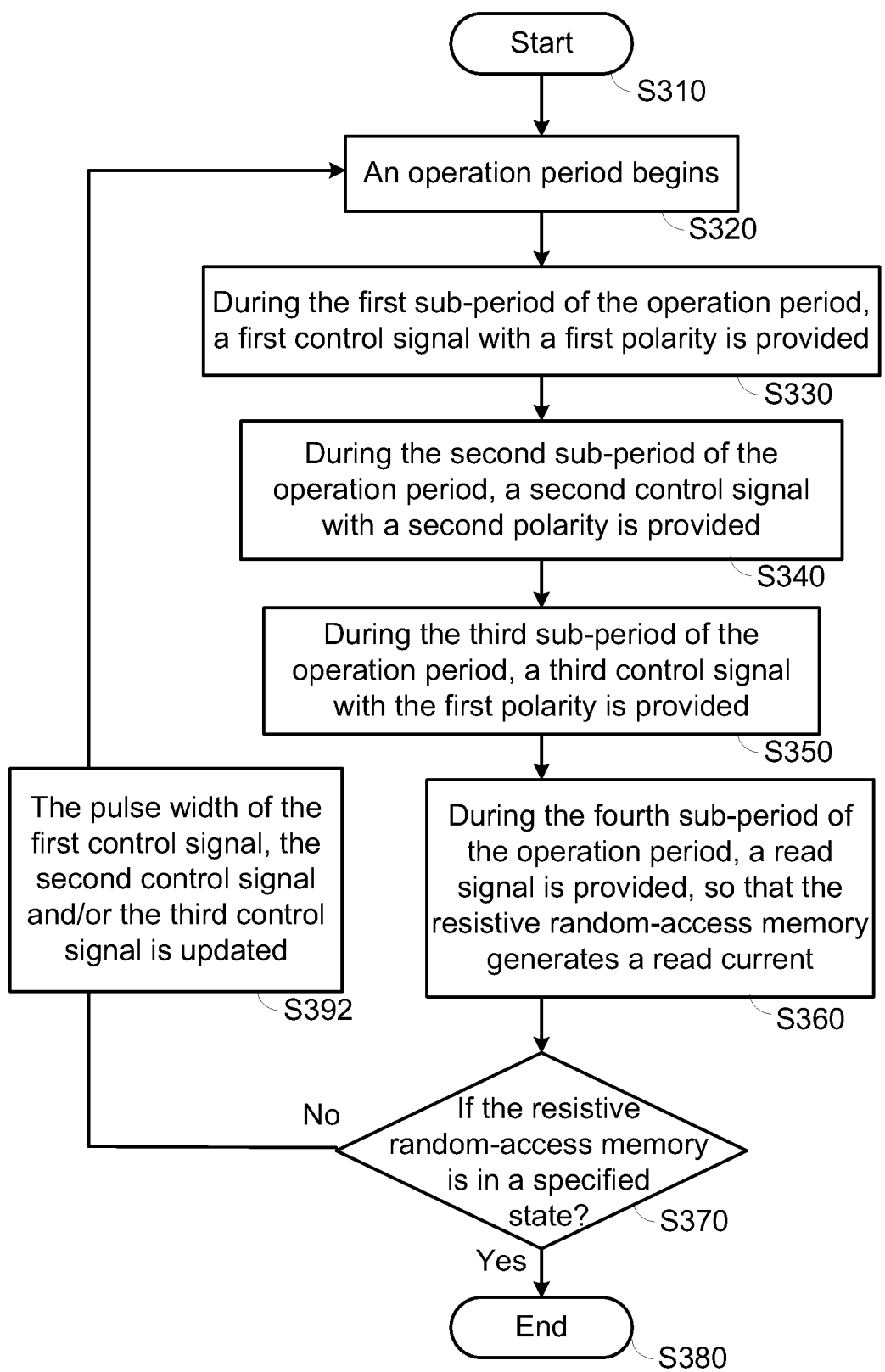
FIG. 5A is a flowchart illustrating a control method of a resistive random-access memory according to a third embodiment of the present invention.

FIG. 5A is a flowchart illustrating a control method of a resistive random-access memory according to a third embodiment of the present invention. In comparison with the first embodiment, the control method of the second embodiment further comprises a step S392.

If the controlling circuit confirms that the resistive random-access memory is not in the specified state according to the read current, the pulse width of the first control signal, the second control signal and/or the third control signal is updated (Step S392). After the step S392, the step S320 is repeatedly done. The procedures of the other steps are similar to those of the first embodiment, and are not redundantly described herein.

In this embodiment, the pulse width of the first control signal, the second control signal and/or the third control signal is updated before the next operation period begins. However, the amplitudes of the first control signal, the second control signal and the third control signal are kept unchanged. In the step S392, the pulse widths of the three control signals are simultaneously updated, the pulse widths of any two of the three control signals are simultaneously updated or the pulse width of any control signal is updated.

Figure 5B:
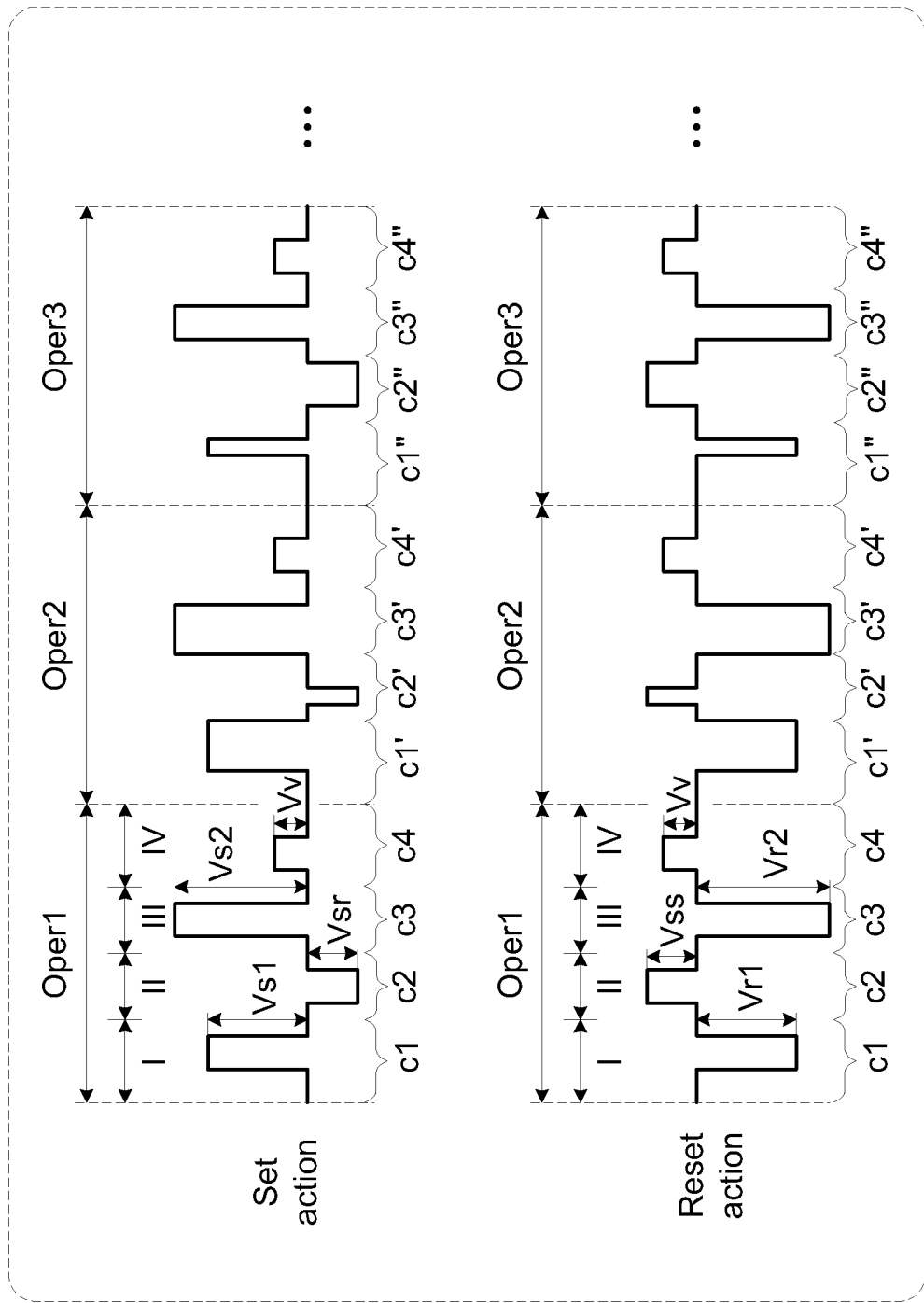
FIG. 5B is a schematic timing waveform diagram of the resistive random-access memory according to the third embodiment of the present invention while a set action and a reset action are performed.

FIG. 5B is a schematic timing waveform diagram of the resistive random-access memory according to the third embodiment of the present invention while a set action and a reset action are performed.

Please refer to the waveform corresponding to the set action. Before the second operation period Oper2 begins, the updated first control signal c1', the updated second control signal c2' and the updated third control signal c3' are sequentially provided to the resistive random-access memory. Before the third operation period Oper3 begins, the updated first control signal c1", the updated second control signal c2" and the updated third control signal c3" are sequentially provided to the resistive random-access memory.

Please refer to the waveform corresponding to the reset action. Before the second operation period Oper2 begins, the updated first control signal c1', the updated second control signal c2' and the updated third control signal c3' are sequentially provided to the resistive random-access memory. Before the third operation period Oper3 begins, the updated first control signal c1", the updated second control signal c2" and the updated third control signal c3" are sequentially provided to the resistive random-access memory.

It is noted that the control method of the second embodiment and the third embodiment may be further modified. For example, for performing the set action or the reset action, both of the amplitude and the pulse width of the first control signal, the second control signal and/or the third control signal are updated before the next operation period begins.

In the above embodiments, the control signal corresponding to each sub-period has a single pulse wave. In some other embodiments, the control signal corresponding to each sub-period has plural pulse waves.

Figure 6:
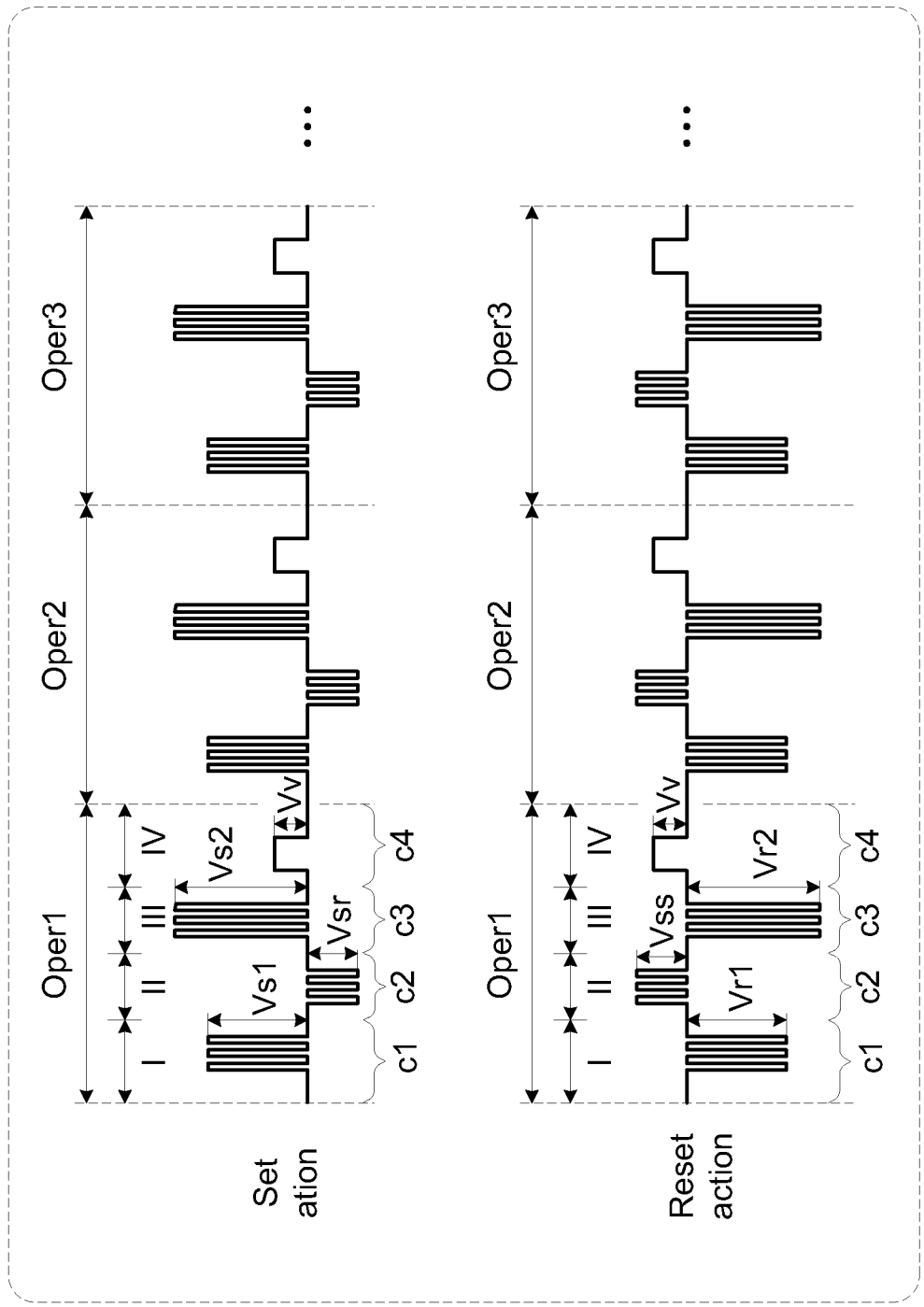
FIG. 6 is a schematic timing waveform diagram of the resistive random-access memory according to a fourth embodiment of the present invention while a set action and a reset action are performed.

FIG. 6 is a schematic timing waveform diagram of the resistive random-access memory according to a fourth embodiment of the present invention while a set action and a reset action are performed. In comparison with the first embodiment, the control signal corresponding to each sub-period has plural pulse waves.

Please refer to the waveform corresponding to the set action. During the first sub-period I, the first control signal c1 with a positive polarity is provided to the resistive random-access memory. The first control signal c1 contains plural pulse waves with the amplitude Vs1. According to the first control signal c1, the resistive random-access memory is in the set state. During the second sub-period, the second control signal c2 with a negative polarity is provided to the resistive random-access memory. The second control signal c2 contains plural pulse waves with the amplitude Vsr. During the third sub-period, the third control signal c3 with the positive polarity is provided to the resistive random-access memory. The third control signal c3 contains plural pulse waves with the amplitude Vs2. According to the third control signal c3, the resistive random-access memory is in the set state. During the fourth sub-period, the read signal c4 with a read voltage Vv is provided to the resistive random-access memory, so that the resistive random-access memory generates a read current. According to the magnitude of the read current, the controlling circuit can verify whether the resistive random-access memory is in the set state.

Please refer to the waveform corresponding to the reset action. During the first sub-period I, a first control signal c1 with the negative polarity is provided to the resistive random-access memory. The first control signal c1 contains plural pulse waves with the amplitude Vr1. According to the first control signal c1, the resistive random-access memory is in the reset state. During the second sub-period, the second control signal c2 with a positive polarity is provided to the resistive random-access memory. The first control signal c2 contains plural pulse waves with the amplitude Vss. During the third sub-period, the third control signal c3 with the negative polarity is provided to the resistive random-access memory. The first control signal c3 contains plural pulse waves with the amplitude Vr2. According to the third control signal c3, the resistive random-access memory is in the reset state. During the fourth sub-period, the read signal c4 with the read voltage Vv is provided to the resistive random-access memory, so that the resistive random-access memory generates a read current. According to the magnitude of the read current, the controlling circuit can verify whether the resistive random-access memory is in the reset state.

From the above descriptions, the present invention provides a control method of a resistive random-access memory. The control method provides various signals for controlling the set action and the reset action of the resistive random-access memory. The resistive random-access memory is sequentially applied with the control signals c1, c2 and c3 which are with different polarity while the set action is performed. The resistive random-access memory is also sequentially applied with the control signals c1, c2 and c3 which are with different polarity while the reset action is performed. Consequently, the stability, the data retention and the reliability of the resistive random-access memory are largely improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control method of a resistive random-access memory, the control method comprising steps of:

(a1) starting to perform an action on the resistive random-access memory, so that the resistive random-access memory has a specified state;
(a2) allowing an operation period to begin;
(a3) providing a first control signal with a first polarity to the resistive random-access memory during a first sub-period of the operation period;
(a4) providing a second control signal with a second polarity to the resistive random-access memory during a second sub-period of the operation period;
(a5) providing a third control signal with the first polarity to the resistive random-access memory during a third sub-period of the operation period; and
(a6) providing a read signal to the resistive random-access memory during a fourth sub-period of the operation period, so that the resistive random-access memory generates a read current, wherein a controlling circuit of the resistive random-access memory verify whether the resistive random-access memory is in the specified state according to the read current;
wherein an amplitude of the third control signal is higher than an amplitude of the first control signal, and the amplitude of the first control signal is higher than an amplitude of the second control signal.

2. The control method as claimed in claim 1, wherein an amplitude of the read signal is smaller than the amplitude of the first control signal, the amplitude of the read signal is smaller than the amplitude of the second control signal, and the amplitude of the read signal is smaller than the amplitude of the third control signal.

3. The control method as claimed in claim 2, wherein the step (a6) comprises steps of:
(b1) if the controlling circuit confirms that the resistive random-access memory is in the specified state, ending the action; and
(b2) if the controlling circuit confirms that the resistive random-access memory is not in the specified state, going back to the step (a2).

4. The control method as claimed in claim 2, wherein the step (a6) comprises steps of:
(c1) if the controlling circuit confirms that the resistive random-access memory is in the specified state, ending the action; and
(c2) if the controlling circuit confirms that the resistive random-access memory is not in the specified state, updating the first control signal, the second control signal and/or the third control signal and then going back to the step (a2).

5. The control method as claimed in claim 4, wherein in the step (c2), an amplitude and/or a pulse width of the first control signal, the second control signal and/or the third control signal is updated.

6. The control method as claimed in claim 2, wherein the action is a set action, and the specified state is a set state.

7. The control method as claimed in claim 2, wherein the action is a reset action, and the specified state is a reset state.

8. The control method as claimed in claim 2, wherein the first control signal, the second control signal and the third control signal are voltage signals or current signals.

9. The control method as claimed in claim 2, wherein the read signal has a read voltage.

10. The control method as claimed in claim 2, wherein the first control signal contains a single pulse wave or plural pulse waves.

11. The control method as claimed in claim 2, wherein the second control signal contains a single pulse wave or plural pulse waves.

12. The control method as claimed in claim 2, wherein the third control signal contains a single pulse wave or plural pulse waves.

* * * * *